US009508563B2

(12) United States Patent
Kwon et al.

(10) Patent No.: US 9,508,563 B2
(45) Date of Patent: *Nov. 29, 2016

(54) METHODS FOR FLIP CHIP STACKING

(75) Inventors: Woon-Seong Kwon, Cupertino, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 663 days.

This patent is subject to a terminal disclaimer.

(21) Appl. No.: 13/548,029

(22) Filed: Jul. 12, 2012

(65) Prior Publication Data

US 2014/0017852 A1 Jan. 16, 2014

(51) Int. Cl.
| | |
|---|---|
| *H01L 21/48* | (2006.01) |
| *H01L 23/14* | (2006.01) |
| *H01L 23/498* | (2006.01) |

(Continued)

(52) U.S. Cl.
CPC ......... *H01L 21/4853* (2013.01); *H01L 23/147* (2013.01); *H01L 23/49827* (2013.01); *H01L 24/75* (2013.01); *H01L 24/81* (2013.01); *H01L 24/97* (2013.01); *H01L 23/49816* (2013.01); *H01L 25/0655* (2013.01); *H01L 2224/131* (2013.01); *H01L 2224/13147* (2013.01); *H01L 2224/16235* (2013.01); *H01L 2224/32225* (2013.01); *H01L 2224/73204* (2013.01); *H01L 2224/7598* (2013.01); *H01L 2224/75744* (2013.01); *H01L 2224/75983* (2013.01); *H01L 2224/75987* (2013.01); *H01L 2224/81005* (2013.01); *H01L 2224/81191* (2013.01); *H01L 2224/81815* (2013.01); *H01L 2224/92125* (2013.01); *H01L 2224/97* (2013.01); *H01L 2924/14* (2013.01); *H01L 2924/157* (2013.01); *H01L 2924/15311* (2013.01); *H01L 2924/3511* (2013.01)

(58) Field of Classification Search
USPC ......... 257/686, 778, 621, E21.503, E23.067, 257/E21.499, E21.502, E21.511, 689, 777; 438/108, 109, 106, 107, 110, 112, 113
See application file for complete search history.

(56) References Cited

U.S. PATENT DOCUMENTS 1,526,757 A * 2/1925 Mueller ......................... 100/31
5,583,736 A   12/1996 Anderson et al.

(Continued)

OTHER PUBLICATIONS

Yoon et al., "3D TSC mid-end processes and assembly/packaging technology", Microelectronics and Packaging Conference (EMPC), 2011 18th European, pp. 1-6, Sep. 2011.*

(Continued)

*Primary Examiner* — Anthony Ho
*Assistant Examiner* — Victor Barzykin
(74) *Attorney, Agent, or Firm* — Gerald Chan; LeRoy D. Maunu

(57) ABSTRACT

A method for flip chip stacking includes forming a cavity wafer comprising a plurality of cavities and a pair of corner guides, placing a through-silicon-via (TSV) interposer with solder bumps coupled to a surface of the TSV interposer on the cavity wafer, such that the solder bumps are situated in the plurality of cavities and the TSV interposer is situated between the pair of corner guides, placing an integrated circuit (IC) die on another surface of the TSV interposer, such that the IC die, the TSV interposer, and the solder bumps form a stacked interposer unit, removing the stacked interposer unit from the cavity wafer, and bonding the solder bumps of the stacked interposer unit to an organic substrate such that the stacked interposer unit and the organic substrate form a flip chip.

20 Claims, 15 Drawing Sheets

(51) Int. Cl.
*H01L 23/00* (2006.01)
*H01L 25/065* (2006.01)

(56) References Cited

U.S. PATENT DOCUMENTS

| | | | |
|---|---|---|---|
| 5,791,486 A * | 8/1998 | Brahmbhatt | 206/725 |
| 6,271,107 B1 * | 8/2001 | Massingill et al. | 438/597 |
| 6,482,677 B2 * | 11/2002 | Sato et al. | 438/109 |
| 6,501,636 B1 | 12/2002 | Savas et al. | |
| 7,034,401 B2 * | 4/2006 | Savastiouk et al. | 257/778 |
| 7,208,342 B2 * | 4/2007 | Lee et al. | 438/106 |
| 7,233,061 B1 * | 6/2007 | Conn | 257/686 |
| 7,348,215 B2 | 3/2008 | Lee | |
| 7,566,960 B1 * | 7/2009 | Conn | 257/686 |
| 7,842,548 B2 * | 11/2010 | Lee et al. | 438/108 |
| 7,863,092 B1 * | 1/2011 | Chaware et al. | 438/106 |
| 8,062,968 B1 * | 11/2011 | Conn | 438/612 |
| 8,263,434 B2 * | 9/2012 | Pagaila et al. | 438/109 |
| 8,313,982 B2 * | 11/2012 | Dunne et al. | 438/110 |
| 2001/0027933 A1 * | 10/2001 | Sasamura et al. | 206/706 |
| 2004/0061207 A1 * | 4/2004 | Ding | 257/678 |
| 2005/0184377 A1 | 8/2005 | Takeuchi et al. | |
| 2007/0018300 A1 * | 1/2007 | Ryu et al. | 257/686 |
| 2008/0284037 A1 | 11/2008 | Andry et al. | |
| 2009/0085202 A1 | 4/2009 | Dang et al. | |
| 2009/0194872 A1 * | 8/2009 | Wang et al. | 257/738 |
| 2009/0263214 A1 | 10/2009 | Lee et al. | |
| 2009/0321948 A1 * | 12/2009 | Wang et al. | 257/777 |
| 2010/0001045 A1 | 1/2010 | Cordes et al. | |
| 2010/0261313 A1 * | 10/2010 | Toh et al. | 438/109 |
| 2011/0035937 A1 | 2/2011 | Lu et al. | |
| 2011/0089552 A1 * | 4/2011 | Park et al. | 257/686 |
| 2011/0193228 A1 * | 8/2011 | Yu et al. | 257/738 |
| 2011/0221072 A1 * | 9/2011 | Chin | 257/777 |
| 2012/0032286 A1 * | 2/2012 | Trusov et al. | 257/417 |
| 2012/0032326 A1 * | 2/2012 | Kim et al. | 257/738 |
| 2012/0098114 A1 * | 4/2012 | Ishibashi | 257/686 |
| 2012/0104623 A1 * | 5/2012 | Pagaila et al. | 257/774 |
| 2012/0133048 A1 * | 5/2012 | Lee et al. | 257/774 |
| 2012/0211885 A1 * | 8/2012 | Choi et al. | 257/737 |
| 2012/0292785 A1 * | 11/2012 | Pagaila et al. | 257/774 |
| 2012/0329249 A1 * | 12/2012 | Ahn et al. | 438/464 |

OTHER PUBLICATIONS

Au et al., "Multi chip stacking & reliability challenges using TSV-micro C4 solder interconnection for FCCSP TSV package", Electronics Packaging Technology Conference (EPTC), 2011 IEEE 13th, pp. 608-619, Dec. 2011.*

Sunohara et al., "Silicon interposer with TSVs (Through Silicon Vias) and fine multilayer wiring", Electronic Components and Technology Conference, 2008, ECTC 2008, 58th , pp. 847-852.*

U.S. Appl. No. 13/548,041, filed Jul. 12, 2012, Kwon et al.

* cited by examiner

METHODS FOR FLIP CHIP STACKING

TECHNICAL FIELD

This Application relates generally to flip chip stacking, and in particular to methods for stacking a flip chip that includes a through-silicon-via (TSV) interposer, an integrated circuit (IC) die, and an organic substrate.

BACKGROUND

Conventional approaches for performing flip chip stacking involve placing a through-silicon-via (TSV) interposer on an organic substrate and subsequently stacking an integrated circuit on the TSV interposer to form a flip chip. Such conventional methods for flip chip stacking are characterized by the particular bonding methods and process parameters involved. Assembly yield for flip chip stacking is significantly influenced by TSV interposer warpage that occurs during conventional flip chip stacking. Conventional flip chip stacking approaches lead to significant amounts of TSV interposer warpage that ultimately affects IC performance and assembly yield.

One approach currently being studied for mitigating the effects of TSV interposer warpage is thermo-compression bonding of IC dies to TSV interposers. However, thermo-compression bonding leads to several side effects such as flux residue and uneven heat profiles, which in turn result in poor soldering performance.

SUMMARY

In accordance with some embodiments, a method for flip chip stacking includes forming a cavity wafer comprising a plurality of cavities and a pair of corner guides, placing a through-silicon-via (TSV) interposer with solder bumps coupled to a surface of the TSV interposer on the cavity wafer, such that the solder bumps are situated in the plurality of cavities and the TSV interposer is situated between the pair of corner guides, placing an integrated circuit (IC) die on another surface of the TSV interposer, such that the IC die, the TSV interposer, and the solder bumps form a stacked interposer unit, removing the stacked interposer unit from the cavity wafer, and bonding the solder bumps of the stacked interposer unit to an organic substrate such that the stacked interposer unit and the organic substrate form a flip chip.

In one or more embodiments, the plurality of cavities extend from a top surface of the cavity wafer to a bottom surface of the cavity wafer.

In one or more embodiments, the method further includes applying a vacuum to the bottom surface of the cavity wafer to hold the TSV interposer with solder bumps in place relative to the cavity wafer.

In one or more embodiments, the method further includes forming a layer of removable glue on a surface of the cavity wafer that includes the plurality of cavities and the pair of corner guides, and placing the TSV interposer with solder bumps on the layer of removable glue, such that the layer of removable glue holds the TSV interposer in place relative to the cavity wafer.

In one or more embodiments, the method further includes performing reflow joining to attach the integrated circuit die to the other surface of the TSV interposer.

In one or more embodiments, the method further includes performing underfilling after the reflow joining is performed.

In one or more embodiments, the act of removing the stacked interposer unit comprises performing chemical dissolution.

In one or more embodiments, the act of bonding the solder bumps of the stacked interposer unit to the organic substrate comprises performing reflow joining.

In one or more embodiments, the method further includes melting IC solder bumps associated with the integrated circuit die.

In one or more embodiments, the plurality of cavities are formed by patterning photoresist on a wafer, performing a reactive ion dry etch of the wafer with the patterned photoresist, and removing the photoresist with an organic solvent.

In one or more embodiments, the method further includes placing another integrated circuit (IC) die on the TSV interposer.

In accordance with other embodiments, a method for flip chip stacking includes forming a support layer on a surface of a wafer, placing a through-silicon-via (TSV) interposer with solder bumps coupled to a surface of the TSV interposer on the support layer, such that the solder bumps are situated at least partially in the support layer and at least a part of the TSV interposer is situated above a surface of the support layer, placing an integrated circuit (IC) die on another surface of the TSV interposer, such that the IC die, the TSV interposer, and the solder bumps form a stacked interposer unit, removing the stacked interposer unit from the support layer, and bonding the solder bumps of the stacked interposer unit to an organic substrate such that the stacked interposer unit and the organic substrate form a flip chip.

In one or more embodiments, the support layer comprises a glue layer and a release layer.

In one or more embodiments, the act of placing the TSV interposer with solder bumps on the support layer comprises situating the solder bumps in both the glue layer and the release layer.

In one or more embodiments, the method further includes performing reflow joining to attach the integrated circuit die to the other surface of the TSV interposer.

In one or more embodiments, the method further includes performing underfilling after the reflow joining is performed.

In one or more embodiments, the act of removing the stacked interposer unit comprises performing chemical dissolution.

In one or more embodiments, the act of bonding the solder bumps of the stacked interposer unit to the organic substrate comprises performing reflow joining.

In one or more embodiments, the method further includes melting IC solder bumps associated with the integrated circuit die.

In one or more embodiments, the method further includes placing another integrated circuit (IC) die on the TSV interposer.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered which are illustrated in the accompanying drawings. These drawings depict only typical embodiments and are not therefore to be considered limiting of the scope of the claims.

FIG. 2 is a flow diagram illustrating a method for flip chip stacking according to some embodiments.

FIGS. 3-1 to 3-8 are cross-sectional views illustrating a method for flip chip stacking according to some embodiments.

FIGS. 4-1 to 4-8 are cross-sectional views illustrating a method for flip chip stacking according to some embodiments.

FIG. 5 is a flow diagram illustrating a method for flip chip stacking according to some embodiments.

FIGS. 6-1 to 6-10 are cross-sectional views illustrating a method for flip chip stacking according to some embodiments.

DETAILED DESCRIPTION

Figure 1:
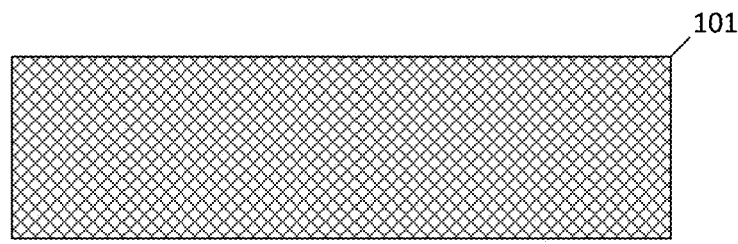
FIGS. 1-1 to 1-5 are cross-sectional views illustrating a method for flip chip stacking.

Various embodiments are described hereinafter with reference to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the invention or as a limitation on the scope of the claimed invention. In addition, and illustrated embodiment need not have all the aspects or advantages shown. An aspect or an advantage described in conjunction with a particular embodiment is not necessarily limited to that embodiment and can be practiced in any other embodiments even if not so illustrated, or if not explicitly described. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

One approach for flip chip stacking involves placing a through-silicon-via (TSV) interposer on an organic substrate and subsequently stacking an integrated circuit on the TSV interposer to form a flip chip. Such method for flip chip stacking may be characterized by an assembly yield of 50-80% depending on the particular bonding methods and process parameters involved. Assembly yield for flip chip stacking is significantly influenced by TSV interposer warpage that occurs during conventional flip chip stacking. Such flip chip stacking approach may lead to significant amounts of TSV interposer warpage that ultimately affects IC performance and assembly yield.

FIGS. 1-1 to 1-5 are cross-sectional views illustrating an approach for flip chip stacking. Initially an organic substrate 101 is formed as illustrated in FIG. 1-1. The organic substrate 101 may include underlying circuitry and various external pads (not shown) for forming connections to the underlying circuitry.

Figures 1, 2:
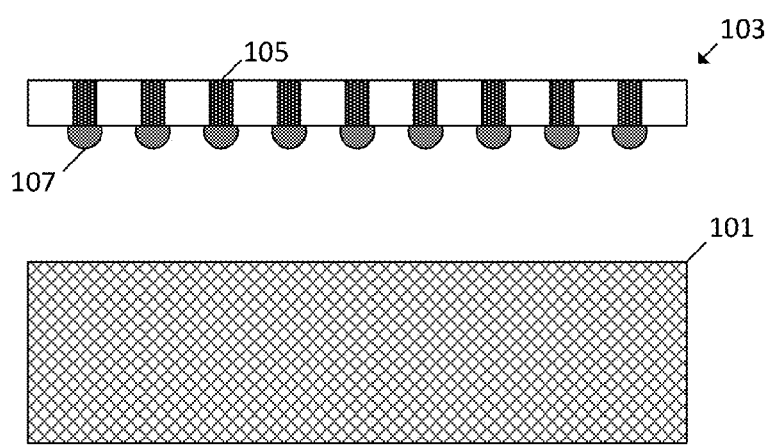

A through-silicon-via (TSV) interposer 103 may then be placed on the organic substrate 101 as illustrated in FIG. 1-2. The TSV interposer includes a plurality of vias 105 that extend from a top surface of the TSV interposer 103 to a bottom surface of the TSV interposer 103 to allow for connections to be made between the top surface and bottom surface. The bottom surface of the TSV interposer 103 is coupled to corresponding solder bumps 107. The solder bumps 107 are coupled to the vias 105 of the TSV interposer 103 to allow for connections to be made to the vias 105. The solder bumps 107 may correspond to external pads (not shown) of the organic substrate 101, such that connections may be formed to the underlying circuitry of the organic substrate 101 through the TSV interposer 103.

Figures 1, 2, 3:
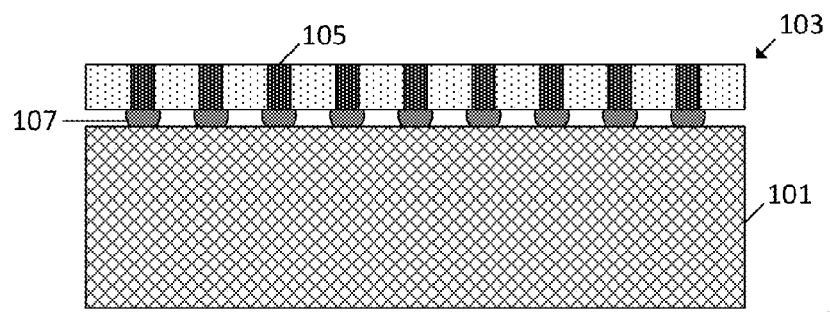

FIG. 1-3 illustrates the TSV interposer 103 after it has been placed on the organic substrate 101. In order to place the TSV interposer 103 on the organic substrate and form connections between vias 105 of the TSV interposer and external pads (not shown) of the organic substrate 101, a process may be used to melt the solder bumps 107 in order to form connections between the TSV interposer 103 and the organic substrate 101.

A plurality of integrated circuit dies 109 may then be placed on the top surface of the TSV interposer 109 to form a flip chip as illustrated in FIG. 1-4. The integrated circuit dies 109 may include IC solder bumps 111 coupled to a bottom surface to form connections between the underlying circuitry of the integrated circuit dies 109 and the vias 105 of the TSV interposer 103.

FIG. 1-5 illustrates the flip chip after the integrated circuit dies 109 have been placed on the top surface of the TSV interposer 103. In order to place the integrated circuit dies 109 on the organic substrate 101 and form connections between vias 105 of the TSV interposer and the IC dies 109, a process may be used to melt the solder bumps or copper pillar bumps 111 in order to form connections between the TSV interposer 103 and the IC dies 109.

Because of the lack of mechanical support provided by the organic substrate 101 during the process of placing the integrated circuit dies 109 on the TSV interposer 103, the TSV interposer 103 suffers from warpage as illustrated in FIG. 1-5. The amount of TSV interposer 103 warpage affects IC performance, with small amounts of warpage leading to some degradation of IC performance and large amounts of warpage ultimately leading to completely ineffective IC performance. This in turn affects assembly yield, as flip chips that suffer from severe TSV interposer warpage will be discarded and not used.

FIG. 2 is a flow diagram illustrating a method for stacking a flip chip according to some embodiments. The method of FIG. 2 eliminates the warpage issue associated with the previously described flip chip stacking approach to accomplish high assembly yield.

Initially a cavity wafer is formed by forming a plurality of cavities and a pair of corner guides in a wafer as described at 201. The plurality of cavities and the pair of corner guides are formed so that they extend downwardly from a top surface of the wafer. In some embodiments, each cavity of the plurality of cavities extends from a top surface of the wafer to a bottom surface of the wafer. In other embodiments, each cavity of the plurality of cavities is formed in the wafer without extending to the bottom surface of the wafer. In some embodiments the plurality of cavities may be formed by first coating the wafer with photo-resist patterned to define the plurality of cavities, performing a reactive ion dry etch of the wafer, and then removing the photo-resist with an organic solvent.

A TSV interposer with solder bumps coupled to a surface of the TSV interposer is placed on the cavity wafer as described at 203. The TSV interposer includes a plurality of vias. The vias extend from a top surface of the TSV interposer to a bottom surface of the TSV interposer to allow for connections to be made between the top surface and bottom surface. The bottom surface of the TSV interposer is coupled to corresponding solder bumps to allow for connections to be made to the vias.

The TSV interposer with solder bumps is placed on the cavity wafer such that the solder bumps are situated in the plurality of cavities and the TSV interposer is situated between the pair of corner guides. By placing the TSV interposer on the cavity wafer, the TSV interposer is mechanically stabilized such that it is immune from warpage during subsequent flip chip stacking processing.

In some embodiments, where each cavity of the plurality of cavities extend from the top surface of the wafer to the bottom surface of the wafer, a vacuum is applied to the bottom surface of the cavity wafer to hold (e.g., mechanically stabilize) the TSV interposer with solder bumps in place. These embodiments will be discussed in further detail below.

In some other embodiments, where each cavity of the plurality of cavities is formed in the wafer without extending to the bottom surface of the wafer, a layer of removable glue is formed on a surface of the cavity wafer that includes the plurality of cavities and the pair of corner guides to hold (e.g., mechanically stabilize) the TSV interposer with solder bumps in place relative to the cavity wafer. These embodiments will be discussed in further detail below.

An integrated circuit (IC) die is then placed on another surface of the TSV interposer to form a stacked interposer unit as described at 205. The integrated circuit (IC), TSV interposer, and solder bumps form the stacked interposer unit. In some embodiments, underfilling may be performed after placing the IC die on the other surface of the TSV, such that the IC, TSV interposer, solder bumps, and underfilling together form the stacked interposer unit.

In some embodiments, a process may be used to melt IC solder bumps coupled to the IC dies in order to form connections between the TSV interposer and the IC dies (e.g., reflow joining). In some embodiments, a single IC die may be placed on the other surface of the TSV interposer. In other embodiments, more than one IC die may be placed on the surface of the TSV interposer. This method for flip chip stacking allows flexibility in the configuration (e.g., number of IC dies) of the stacked interposer unit.

Because the TSV interposer and solder bumps are mechanically stabilized by the plurality of cavities and pair of corner guides, placing the integrated circuit die on the surface of the TSV interposer to form a stacked interposer unit will not cause warpage to occur to the TSV interposer.

The stacked interposer unit (e.g., integrated circuit, TSV interposer, and solder bumps) is then removed from the cavity wafer as described at 207. In some embodiments, where a vacuum is applied to the bottom surface of the cavity wafer to hold (e.g., mechanically stabilize) the TSV interposer with solder bumps in place relative to the cavity wafer, the vacuum may simply be removed or turned off to allow the stacked interposer unit to be removed from the cavity wafer. In some other embodiments, where a layer of removable glue is formed on a surface of the cavity wafer that includes the plurality of cavities and the pair of corner guides to hold (e.g., mechanically stabilize) the TSV interposer with solder bumps in place relative to the cavity wafer, a chemical dissolution process may be used to remove the stacked interposer unit from the cavity wafer.

Once the stacked interposer unit has been removed, the solder bumps of the stacked interposer unit may then be bonded to an organic substrate to form a flip chip as described at 209. In some embodiments, the stacked interposer unit may be bonded to the organic substrate by a process known as reflow joining. The stacked interposer unit (e.g., IC dies, TSV interposer, and solder bumps) and the organic substrate together form the flip chip. The organic substrate may include underlying circuitry and various external pads for forming connections to its underlying circuitry. The solder bumps may correspond to external pads of the organic substrate, such that connections may be formed from the IC dies to the underlying circuitry of the organic substrate through the TSV interposer.

By introducing a cavity wafer to mechanically support the TSV interposer during the process of placing IC dies on the TSV interposer, the TSV interposer may be shielded from warpage, thereby improving IC die performance and assembly yield in comparison to conventional flip chip stacking approached.

FIGS. 3-1 to 3-8 are cross-sectional views illustrating a method for flip chip stacking according to some embodiments. Initially a cavity wafer 301 is formed as illustrated in FIG. 3-1. The cavity wafer 301 includes a plurality of cavities 303 and a pair of corner guides 305.

A TSV interposer with solder bumps coupled to a bottom surface of the TSV interposer is then placed on the cavity wafer as illustrated in FIG. 3-2. It should be noted that within the context of the subject application, when a first item (e.g., the TSV interposer) is described as being placed "on" a second item e.g., the cavity wafer), the first item may contact the second item (in which case, the first item may be considered as directly "on" the second item), or the first item may not contact the second item (such as in the situation in which there is a third item between the first and second items, in which case, the first item may be considered as indirectly "on" the second item). The TSV interposer 103 includes a plurality of vias 105 that extend from a top surface of the TSV interposer 103 to a bottom surface of the TSV interposer 103 to allow for connections to be made between the top surface and bottom surface. The bottom surface of the TSV interposer 103 is coupled to corresponding solder bumps 107. The solder bumps 107 are coupled to the vias 105 of the TSV interposer 103 to allow for connections to be made to the vias 105. The solder bumps 107 may correspond to external pads of an external component (e.g., organic substrate), such that connections may be formed to the underlying circuitry of the external component through the TSV interposer 103.

FIG. 3-3 illustrates the TSV interposer 103 after it has been placed on the cavity wafer 301. In placing the TSV interposer 103 on the cavity wafer a layer of removable glue (not shown) may be formed on a surface of the cavity wafer that includes the plurality of cavities and the pair of corner guides to hold the TSV interposer with solder bumps in place relative to the cavity wafer. The TSV interposer 103 and solder bumps 107 are placed on the cavity wafer 301 such that the solder bumps 107 are situated in the plurality of cavities 303 and the TSV interposer 103 is situated between the pair of corner guides 105. In this way, the TSV interposer 103 and solder bumps 107 may be mechanically stabilized by the cavity wafer 301 during subsequent flip chip stacking processes.

Figures 1, 2, 3, 4:
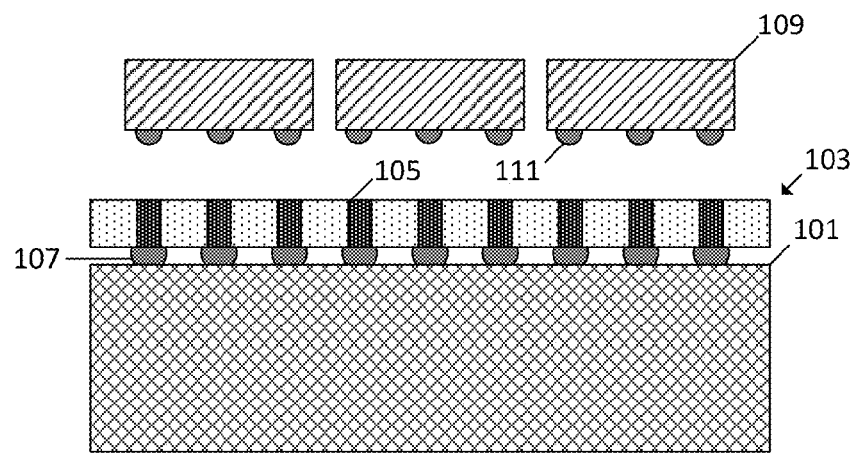

One or more IC dies 109 may then be placed on the TSV interposer 103 as illustrated in FIG. 3-4. The integrated circuit dies 109 may include IC solder bumps 111 coupled to a bottom surface to form connections between the underlying circuitry of the integrated circuit dies 109 and the vias 105 of the TSV interposer 103. In some embodiments, the IC solder bumps 111 may be copper pillar bumps.

Figures 1, 2, 3, 4, 5:
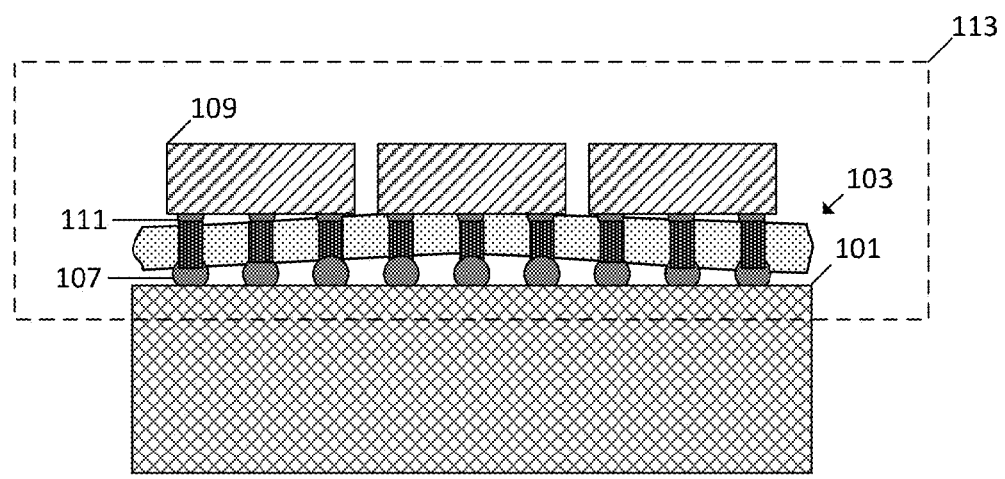
Figure 2:
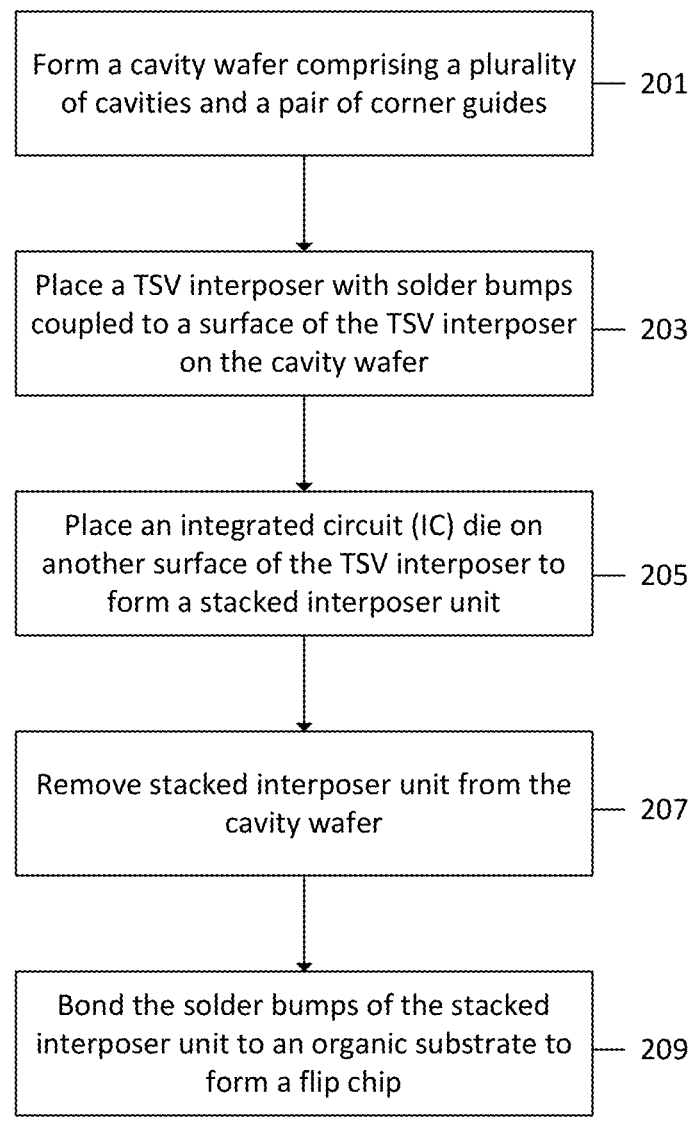

FIG. 3-5 illustrates the integrated circuit dies 109 after they have been placed on the top surface of the TSV interposer 103. The integrated circuit dies 109, TSV interposer 103, and solder bumps 107 together form a stacked interposer unit 113. In some embodiments, underfilling may be performed after placing the IC dies 109 on the other surface of the TSV, such that the IC dies 109, TSV interposer 103, solder bumps 107, and underfilling (not shown) together form the stacked interposer unit 113. In order to place the integrated circuit dies 109 on the organic substrate 101 and form connections between vias 105 of the TSV interposer and the IC dies 109, a process known as reflow joining may be used to melt the IC solder bumps 111 to form connections between the TSV interposer 103 and the IC dies 109.

The stacked interposer unit 113 may then be removed from the cavity wafer as illustrated in FIG. 3-6. In some embodiments, a chemical dissolution process may be used to remove the stacked interposer unit from the cavity wafer. The chemical dissolution effectively releases the stacked interposer unit 113 from the removable glue layer (not shown) formed on the surface of the cavity wafer.

The stacked interposer unit 113 may then be bonded to an organic substrate 101, as illustrated in FIG. 3-7. As discussed above, the organic substrate may include underlying circuitry and various external pads (not shown) for forming connections to the underlying circuitry. The stacked interposer unit 113 may be placed such that solder bumps 107 correspond to external pads (not shown) of the organic substrate so that connections may be formed from the IC dies to the underlying circuitry of the organic substrate 101 through the TSV interposer 103.

FIG. 3-8 illustrates stacked interposer unit 113 after it has been bonded to the organic substrate 101. The stacked interposer unit 113 (e.g., IC dies 109, TSV interposer 103, and solder bumps 107) and the organic substrate 101 together form the flip chip 300. In some embodiments, a process known as reflow joining may be used to melt solder bumps 107 coupled to the bottom surface of the TSV interposer 103 in order to form connections between the TSV interposer 103 and the organic substrate 101.

As discussed above, by introducing a cavity wafer to mechanically support the TSV interposer during the process of placing IC dies on the TSV interposer, the TSV interposer may be shielded from warpage, thereby improving IC die performance and assembly yield in comparison to conventional flip chip stacking approached.

FIGS. 4-1 to 4-8 are cross-sectional views illustrating a method for flip chip stacking according to some other embodiments. The method described in FIGS. 4-1 to 4-8 also uses a cavity wafer to provide mechanical stabilization to a TSV interposer. However, rather than using a plurality of cavities wherein each cavity of the plurality of cavities is formed in the wafer without extending to the bottom surface of the wafer, the cavity wafer of FIGS. 4-1 to 4-8 comprises cavities that extend from the top surface of the wafer to the bottom surface of the wafer. FIG. 4-1 illustrates a cavity wafer 400 with a plurality of cavities 405 that extend from a top surface of the cavity wafer 400 to a bottom surface of the cavity wafer 400. The cavity wafer 400 also includes a pair of corner guides 403.

A TSV interposer 103 with solder bumps 107 coupled to a bottom surface of the TSV interposer 103 is then placed into the cavity wafer 400 as illustrated in FIG. 4-2. As described above, the TSV interposer 103 includes a plurality of vias 105 that extend from a top surface of the TSV interposer 103 to a bottom surface of the TSV interposer 103 to allow for connections to be made between the top surface and bottom surface. The bottom surface of the TSV interposer 103 is coupled to corresponding solder bumps 107. The solder bumps 107 are coupled to the vias 105 of the TSV interposer 103 to allow for connections to be made to the vias 105. The solder bumps 107 may correspond to external pads of an external component (e.g., organic substrate), such that connections may be formed to the underlying circuitry of the external component through the TSV interposer 103.

FIG. 4-3 illustrates the TSV interposer 103 after it has been placed in the cavity wafer 401. In/after placing the TSV interposer 103 in the cavity wafer, a vacuum is applied to the bottom surface of the cavity wafer 401 to hold (e.g., mechanically stabilize) the TSV interposer 103 with solder bumps 107 in place relative to the cavity wafer 401. The TSV interposer 103 and solder bumps 107 are placed on the cavity wafer 401 such that the solder bumps 107 are situated in the plurality of cavities 403 and the TSV interposer 103 is situated between the pair of corner guides 405. In this way, the TSV interposer 103 and solder bumps 107 may be mechanically stabilized by the cavity wafer 401 during subsequent flip chip stacking processes.

One or more IC dies 109 may then be placed on the TSV interposer 103 as illustrated in FIG. 4-4. The integrated circuit dies 109 may include IC solder bumps 111 coupled to a bottom surface to form connections between the underlying circuitry of the integrated circuit dies 109 and the vias 105 of the TSV interposer 103. In some embodiments, the IC solder bumps 111 may be copper pillar bumps.

FIG. 4-5 illustrates the integrated circuit dies 109 after they have been placed on the top surface of the TSV interposer 103. The integrated circuit dies 109, TSV interposer 103, and solder bumps 107 together form a stacked interposer unit 113. In some embodiments, underfilling may be performed after placing the IC die 109 on the other surface of the TSV interposer 103, such that the IC dies 109, TSV interposer 103, solder bumps 107, and underfilling (not shown) together form the stacked interposer unit. In order to place the integrated circuit dies 109 on the organic substrate 101 and form connections between vias 105 of the TSV interposer and the IC dies 109, a process known as reflow joining may be used to melt the IC solder bumps 111 to form connections between the TSV interposer 103 and the IC dies 109.

Figures 1, 3:
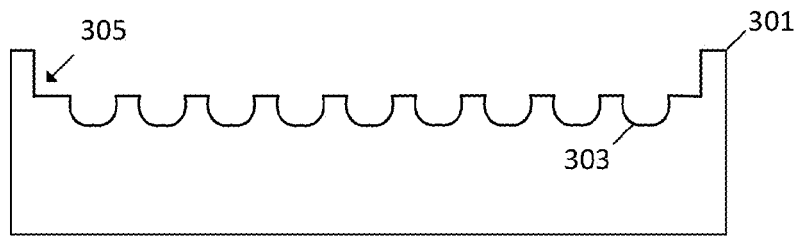
Figures 2, 3:
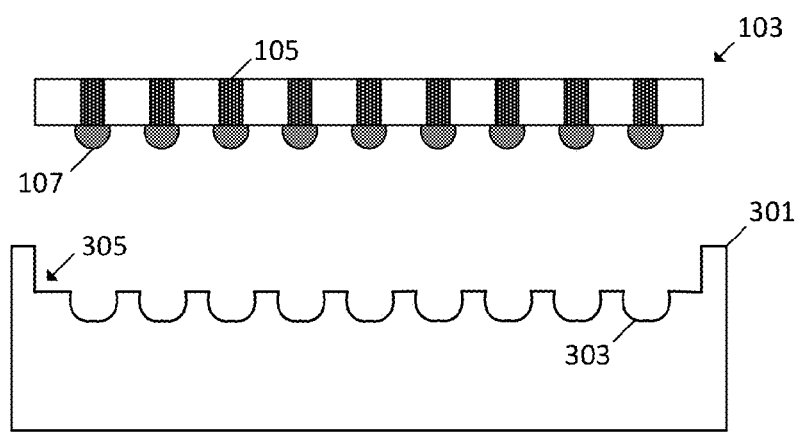
Figure 3:
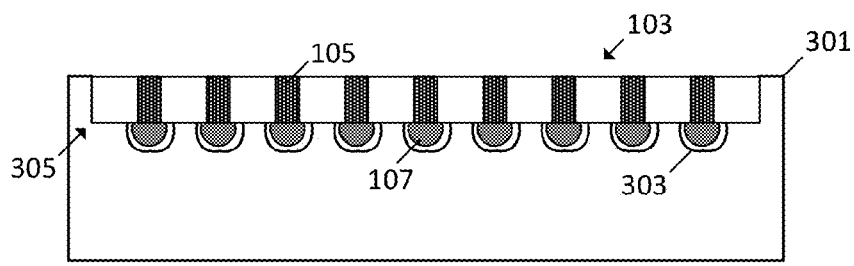
Figures 3, 4:
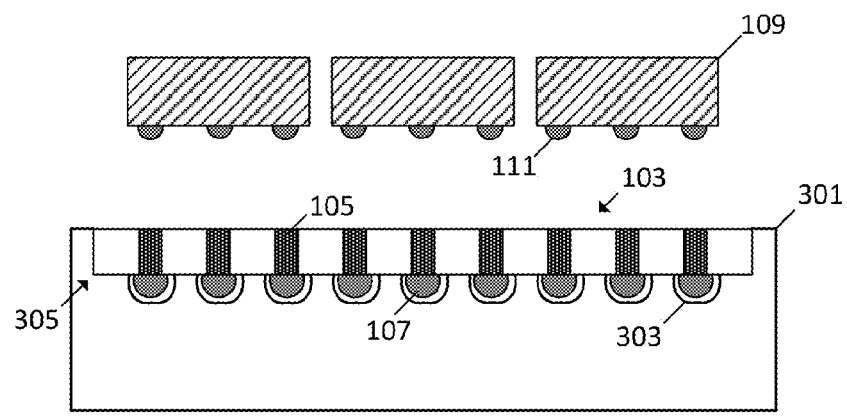
Figures 3, 4, 5:
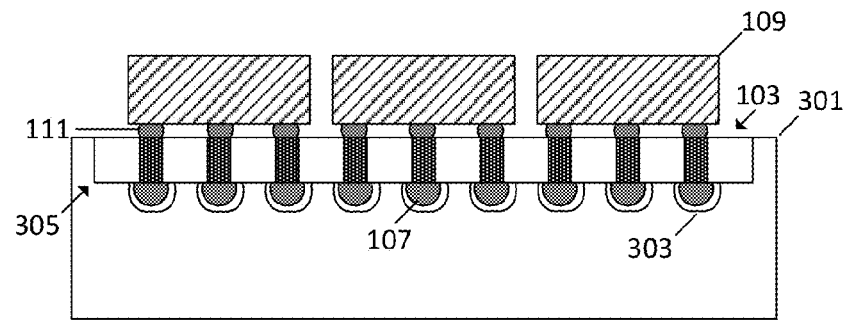
Figures 3, 4, 5, 6:
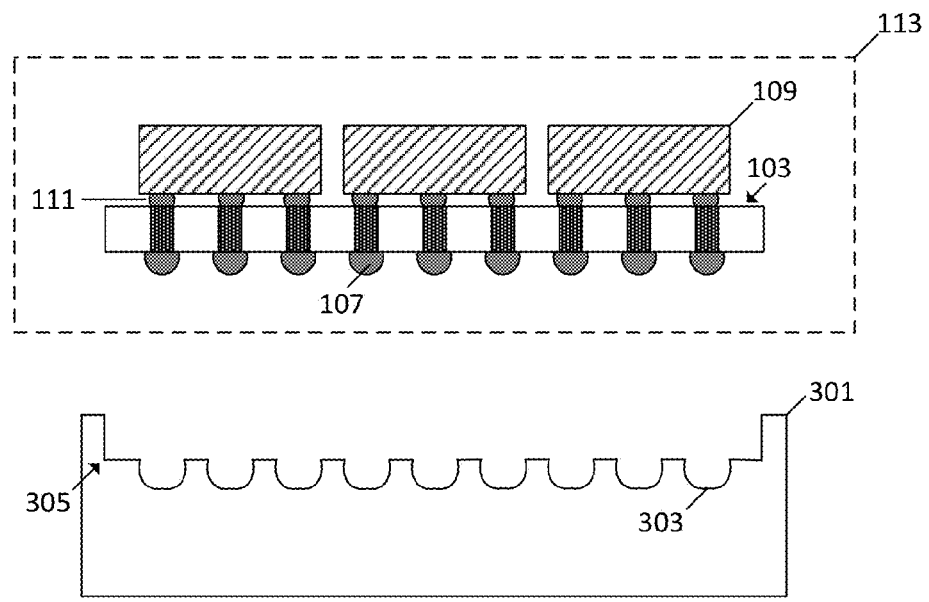

The stacked interposer unit 113 may then be removed from the cavity wafer 401 as illustrated in FIG. 4-6. In some embodiments, the stacked interposer unit 113 may simply be removed from the cavity wafer 401 by simply turning off the vacuum.

The stacked interposer unit 113 may then be bonded to an organic substrate 101, as illustrated in FIG. 4-7. In some embodiments, the stacked interposer unit 113 may be bonded to the organic substrate 101 using a process known as reflow joining. As discussed above, the organic substrate may include underlying circuitry and various external pads (not shown) for forming connections to the underlying circuitry. The stacked interposer unit 113 may be placed such that solder bumps 107 correspond to external pads (not shown) of the organic substrate so that connections may be formed from the IC dies 109 to the underlying circuitry of the organic substrate 101 through the TSV interposer 103.

FIG. 4-8 illustrates stacked interposer unit 113 after it has been bonded to the organic substrate 101. The stacked interposer unit 113 (e.g., IC dies 109, TSV interposer 103, and solder bumps 107) and the organic substrate 101 together form the flip chip 300. In some embodiments, a process may be used to melt solder bumps 107 coupled to the bottom surface of the TSV interposer 103 in order to form connections between the TSV interposer 103 and the organic substrate 101.

Much like the method for flip chip stacking described in FIGS. 3-1 to 3-8, by introducing a cavity wafer to mechanically support the TSV interposer during the process of placing IC dies on the TSV interposer, the TSV interposer may be shielded from warpage, thereby improving IC die performance and assembly yield in comparison to conventional flip chip stacking approached.

The methods depicted in FIGS. 3-1 to 3-8 and FIG. 4-1 to 4-8 utilize cavity wafers in order to provide mechanical stabilization for provide TSV interposers during the process of flip chip stacking. Alternatively, a wafer with a support layer may also be utilized to provide mechanical stabilization to TSV interposers during the process of flip chip stacking. FIG. 5 and FIGS. 6-1 to 6-10 will illustrate the use of a support layer to provide mechanical stabilization to TSV interposers during the process of flip chip stacking.

FIG. 5 is a flow diagram illustrating a method for flip chip stacking utilizing a support layer according to some embodiments. Initially a support layer is formed on a surface of a layer as described at 501. In some embodiments, the support layer may comprise a glue layer and a release layer. The glue layer may be formed first on a surface of the wafer, with the release layer being subsequently formed on a surface of the glue layer.

A TSV interposer with solder bumps coupled to a surface of the TSV interposer is placed on the cavity wafer as described at 503. The TSV interposer includes a plurality of vias. The vias extend from a top surface of the TSV interposer to a bottom surface of the TSV interposer to allow for connections to be made between the top surface and bottom surface. The bottom surface of the TSV interposer is coupled to corresponding solder bumps to allow for connections to be made to the vias.

The TSV interposer with solder bumps is placed on the support layer such that the solder bumps are situated at least partially in the support layer, and other part(s) of the TSV interposer is situated above (e.g., on) a surface of the support layer. By placing the TSV interposer with solder bumps at least partially in the support layer, the TSV interposer is mechanically stabilized such that it is immune from warpage during subsequent flip chip stacking processing. In some embodiments, it may be necessary to apply adequate temperature and pressure in order to place the TSV interposer with solder bumps into the support layer such that the solder bumps are situated at least partially in the support layer, and other part(s) of the TSV interposer is situated on a surface of the support layer.

An integrated circuit (IC) die is then placed on another surface of the TSV interposer to form a stacked interposer unit as described at 505. The integrated circuit (IC), TSV interposer, and solder bumps form the stacked interposer unit. In some embodiments, underfilling may be performed after placing the IC die on the other surface of the TSV, such that the IC, TSV interposer, solder bumps, and underfilling together form the stacked interposer unit.

In some embodiments, a process known as reflow joining may be used to melt IC solder bumps coupled to the IC dies in order to form connections between the TSV interposer and the IC dies. In some embodiments, a single IC die may be placed on the other surface of the TSV interposer. In other embodiments, more than one IC die may be placed on the surface of the TSV interposer. This method for flip chip stacking allows flexibility in the configuration (e.g., number of IC dies) of the stacked interposer unit.

Because the TSV interposer and solder bumps are mechanically stabilized by the support layer formed on top of the wafer, placing the integrated circuit die on the surface of the TSV interposer to form a stacked interposer unit will not cause warpage to occur to the TSV interposer.

The stacked interposer unit (e.g., integrated circuit, TSV interposer, and solder bumps) is then mechanically removed from the support layer as described at 507. In some embodiments, a chemical dissolution process may be used to remove the stacked interposer unit from the support layer.

Once the stacked interposer unit has been removed, the solder bumps of the stacked interposer unit may then be bonded to an organic substrate to form a flip chip as described at 509. The stacked interposer unit (e.g., IC dies, TSV interposer, and solder bumps) and the organic substrate together form the flip chip. The organic substrate may include underlying circuitry and various external pads for forming connections to its underlying circuitry. The solder bumps may correspond to external pads of the organic substrate, such that connections may be formed from the IC dies to the underlying circuitry of the organic substrate through the TSV interposer.

By introducing a support layer to mechanically support the TSV interposer during the process of placing IC dies on the TSV interposer, the TSV interposer may be shielded from warpage, thereby improving IC die performance and assembly yield in comparison to conventional flip chip stacking approached.

FIGS. 6-1 to 6-10 are cross-sectional views illustrating a method for flip chip stacking according to some other embodiments. The method described in FIGS. 6-1 to 6-10 uses a support layer to provide mechanical stabilization to a TSV interposer.

FIG. 6-1 illustrates a support wafer 601 that facilitates mechanical stabilization of a TSV interposer during flip chip stacking. A glue layer 603 is formed on the surface of the wafer 601 as illustrated in FIG. 6-2. A release layer 605 is then formed on a surface of the glue layer 603 as illustrated in FIG. 6-3. The release layer 605 and glue layer 603 together form a support layer 607 for providing mechanical stabilization to the TSV interposer during subsequent flip chip stack processing.

A TSV interposer 103 with solder bumps 107 coupled to a bottom surface of the TSV interposer 103 is then placed on the support layer as illustrated in FIG. 6-4. As described above, the TSV interposer 103 includes a plurality of vias 105 that extend from a top surface of the TSV interposer 103 to a bottom surface of the TSV interposer 103 to allow for connections to be made between the top surface and bottom surface. The bottom surface of the TSV interposer 103 is coupled to corresponding solder bumps 107. The solder bumps 107 are coupled to the vias 105 of the TSV interposer 103 to allow for connections to be made to the vias 105. The solder bumps 107 may correspond to external pads of an external component (e.g., organic substrate), such that connections may be formed to the underlying circuitry of the external component through the TSV interposer 103.

FIG. 6-5 illustrates the TSV interposer 103 after it has been placed on the support layer 607. The TSV interposer 103 and solder bumps 107 are placed on the support layer 607 formed on the support wafer 601 such that the solder bumps 107 are situated at least partially in the support layer 607, and other part(s) of the TSV interposer 103 is situated above (e.g., on) a surface of the support layer 607. In this way, the TSV interposer 103 and solder bumps 107 may be mechanically stabilized by the support layer 607 during subsequent flip chip stacking processes.

One or more IC dies 109 may then be placed on the TSV interposer 103 as illustrated in FIG. 6-6. The integrated circuit dies 109 may include IC solder bumps 111 coupled to a bottom surface to form connections between the underlying circuitry of the integrated circuit dies 109 and the vias 105 of the TSV interposer 103.

Figures 3, 4, 5, 6, 7:
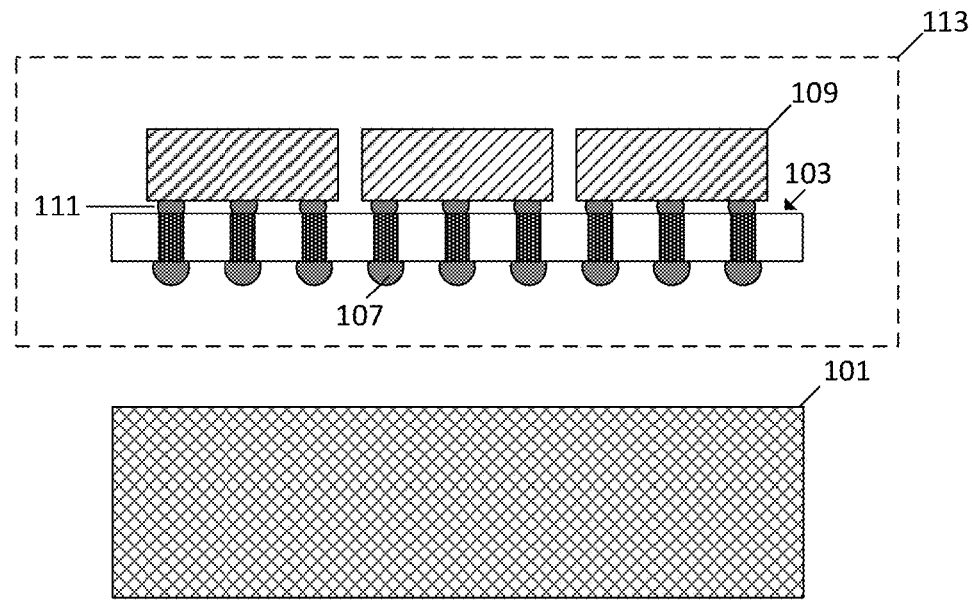

FIG. 6-7 illustrates the integrated circuit dies 109 after they have been placed on the top surface of the TSV interposer 103. The integrated circuit dies 109, TSV interposer 103, and solder bumps 107 together form a stacked interposer unit 113. In some embodiments, underfilling may be performed after placing the IC die 109 on the other surface of the TSV interposer 103, such that the IC die 109, TSV interposer 103, solder bumps 107, and underfilling (not shown) together form the stacked interposer unit. In order to place the integrated circuit dies 109 on the organic substrate 101 and form connections between vias 105 of the TSV interposer and the IC dies 109, a process known as reflow joining may be used to melt the IC solder bumps 111 to form connections between the TSV interposer 103 and the IC dies 109.

Figures 3, 4, 5, 6, 7, 8:
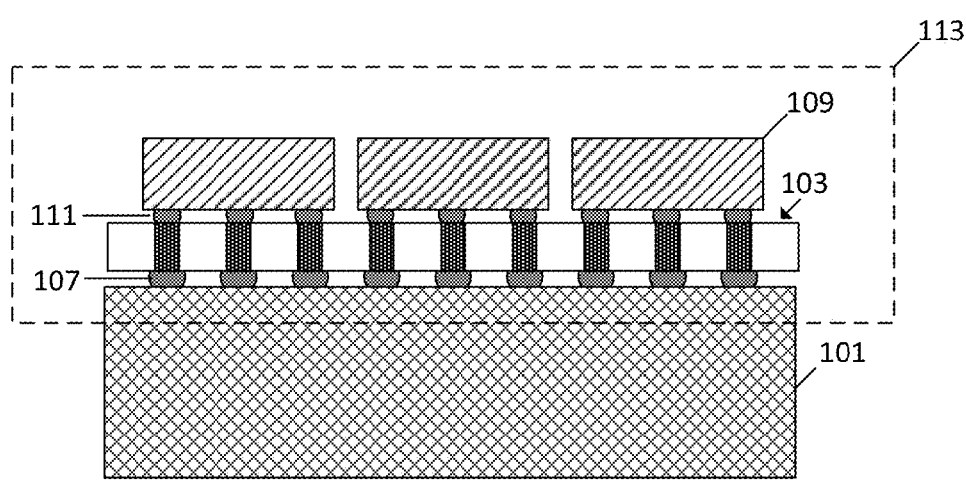
Figures 1, 4:
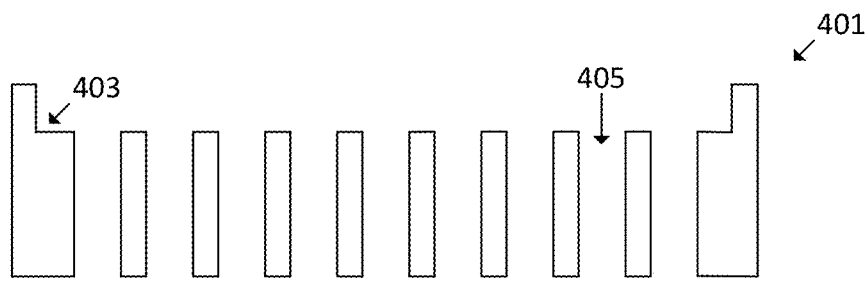
Figures 2, 4:
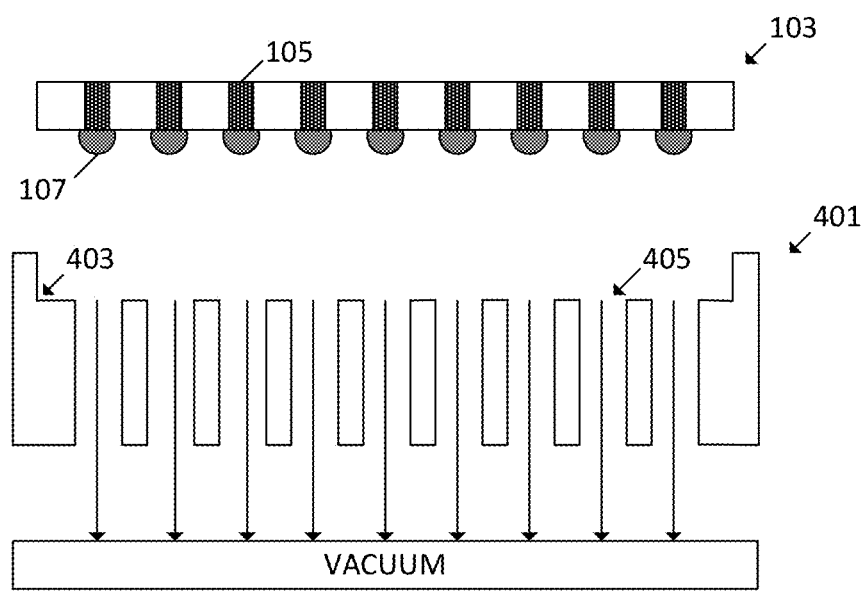
Figures 3, 4:
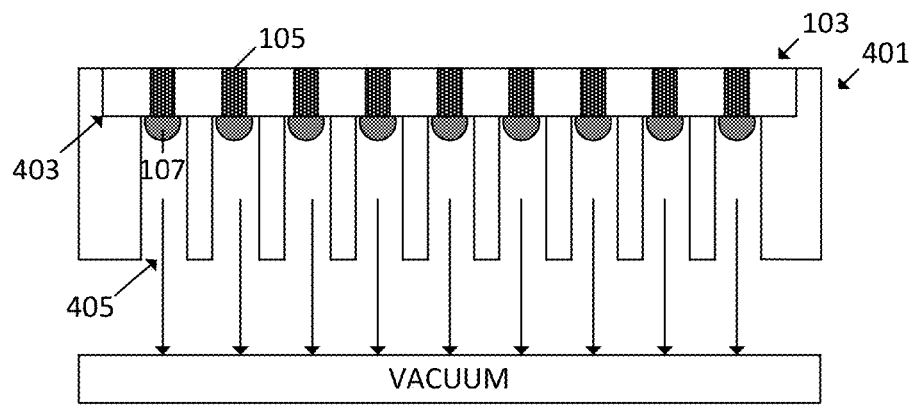
Figure 4:
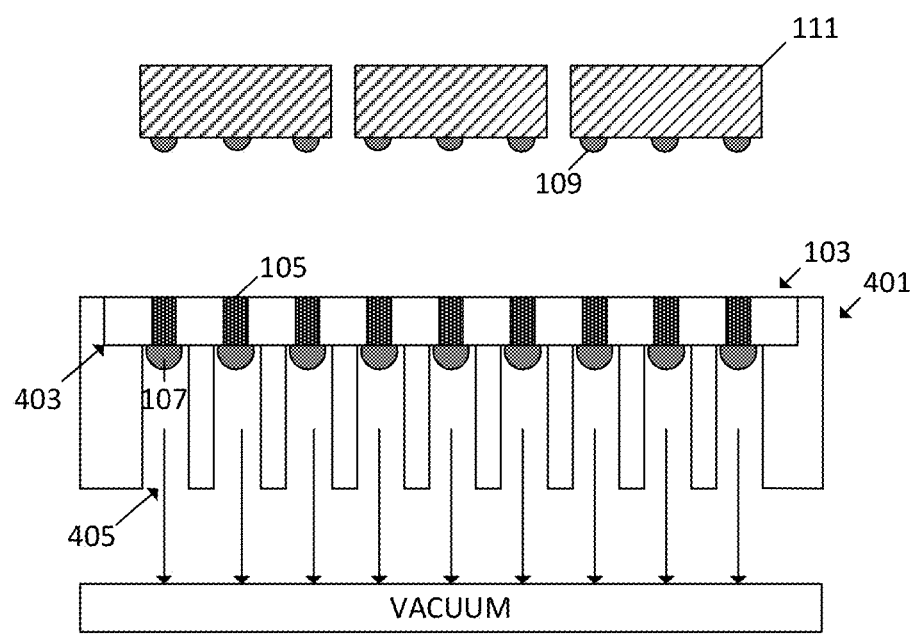
Figures 4, 5:
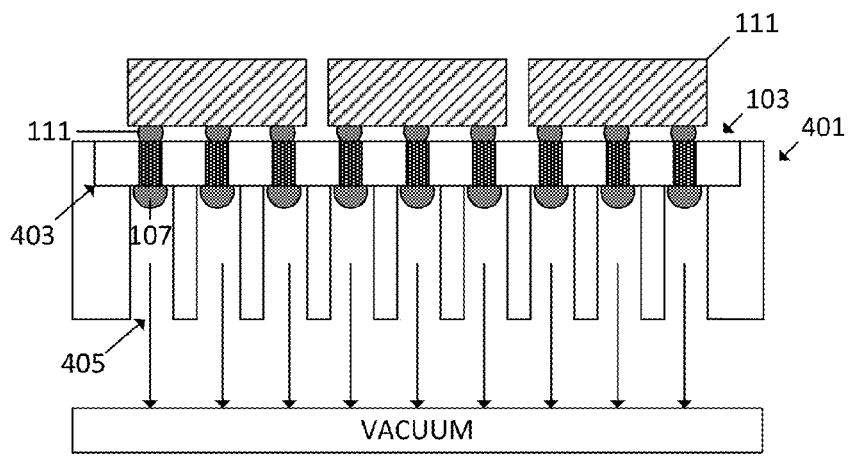
Figures 4, 5, 6:
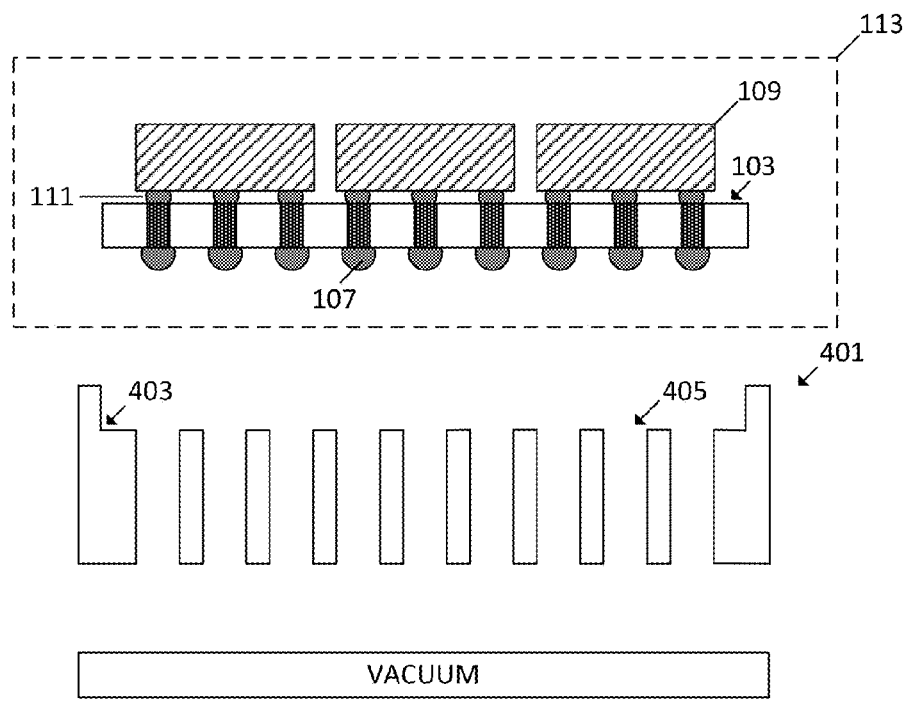
Figures 4, 5, 6, 7:
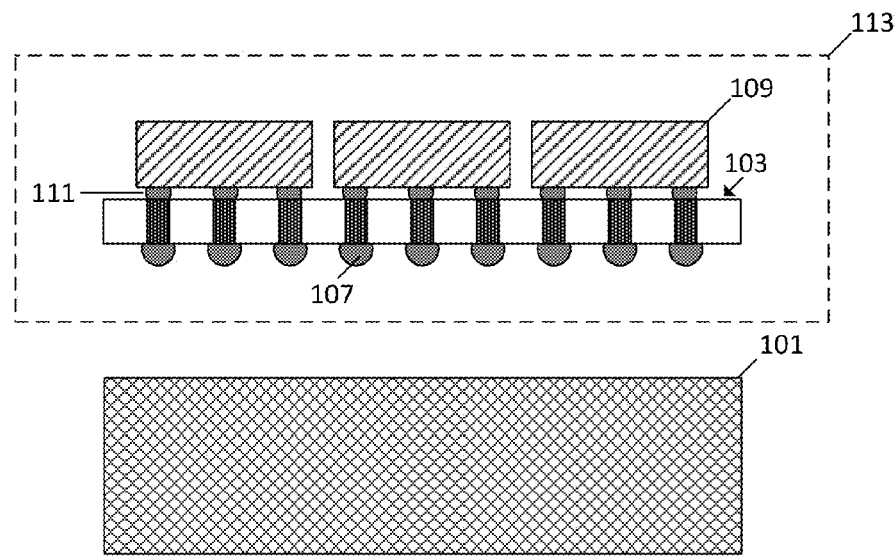
Figures 4, 5, 6, 7, 8:
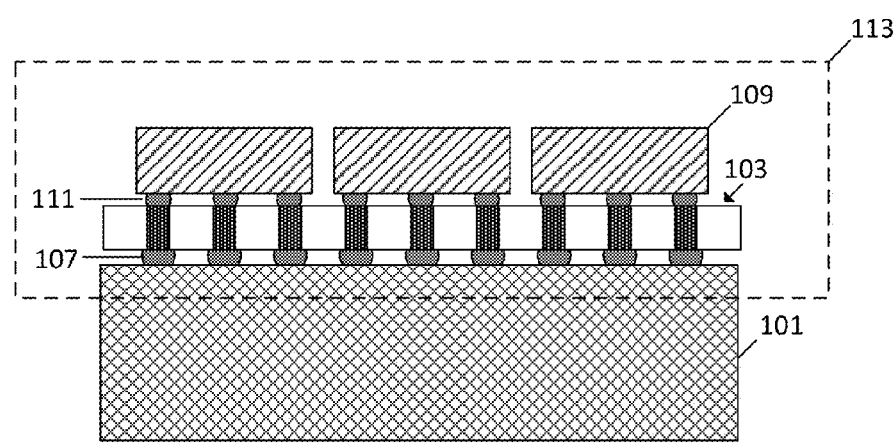
Figure 5:
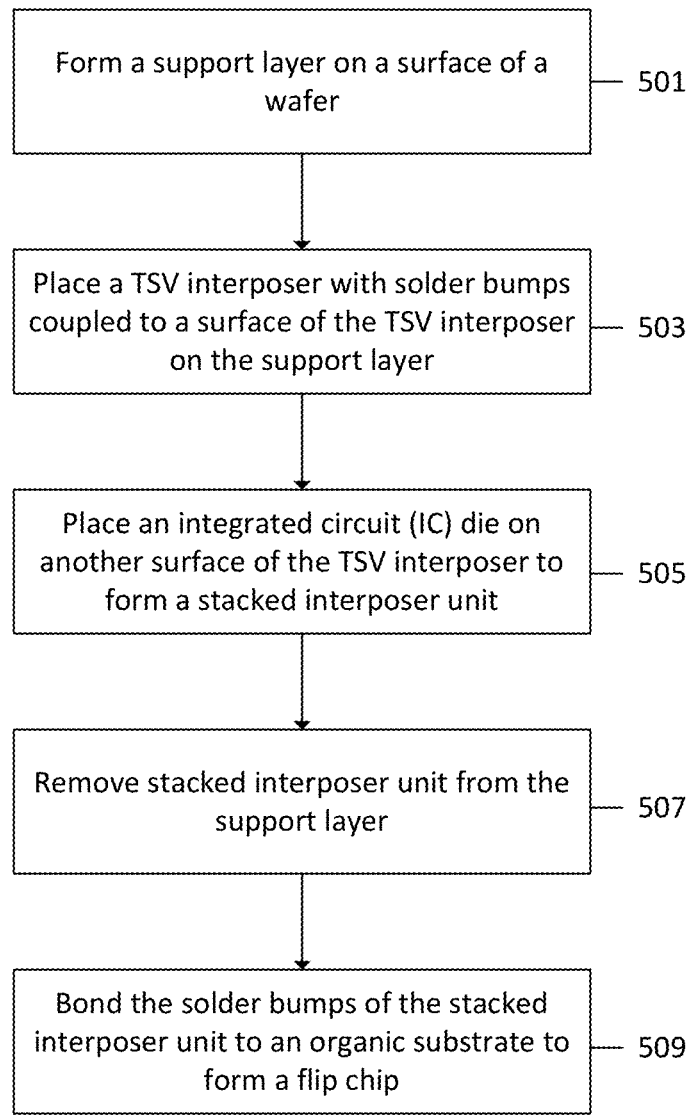
Figures 1, 6:
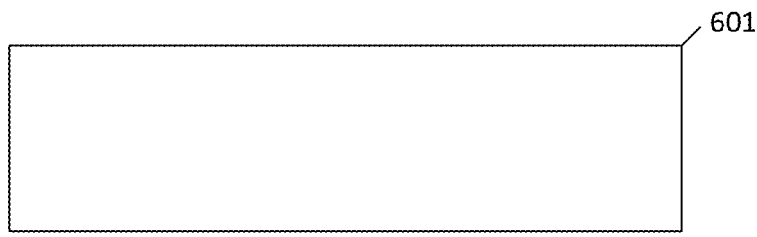
Figures 2, 6:
Figures 3, 6:
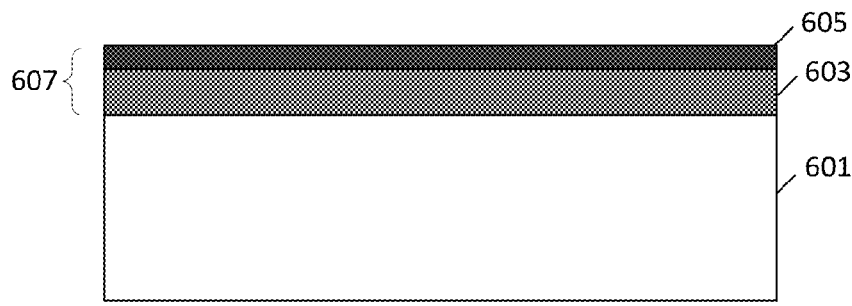
Figures 4, 6:
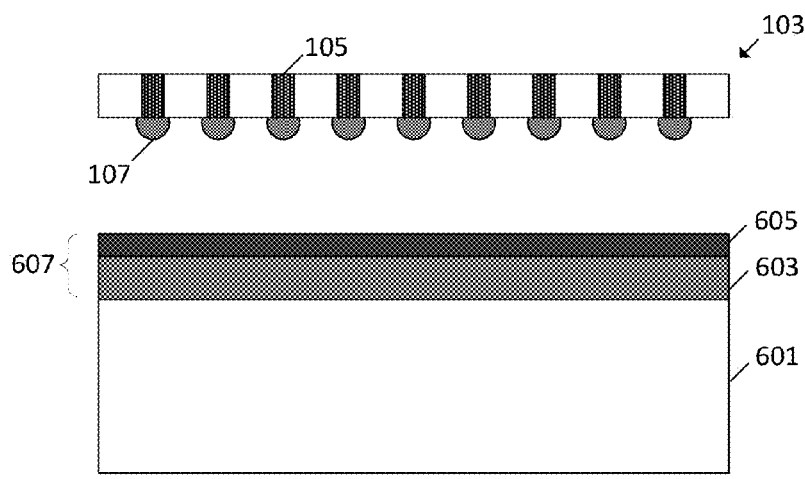
Figures 5, 6:
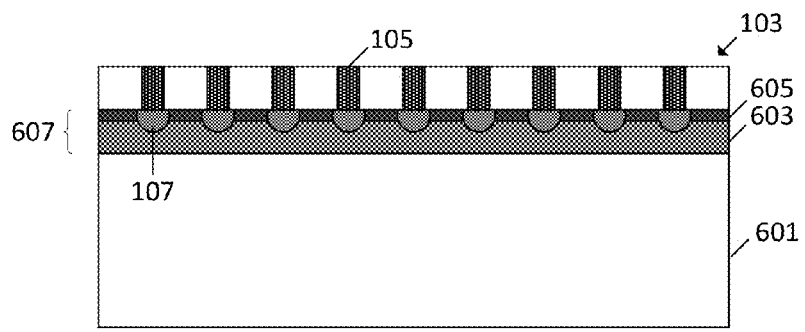
Figure 6:
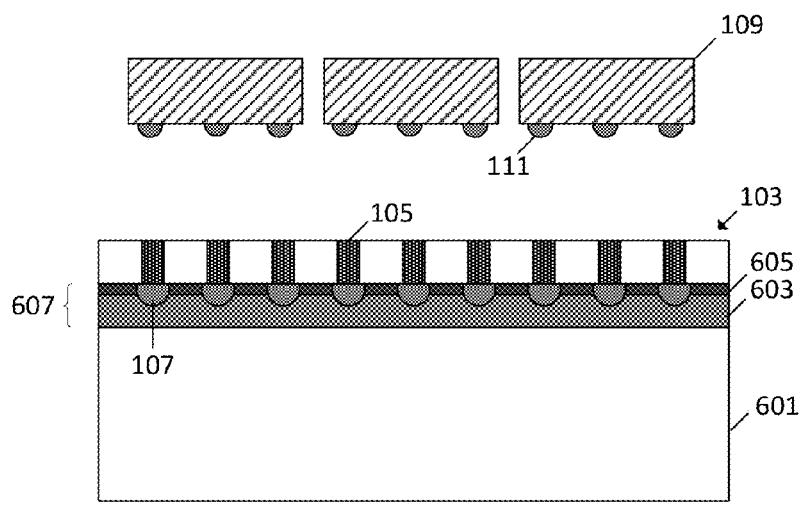
Figures 6, 7:
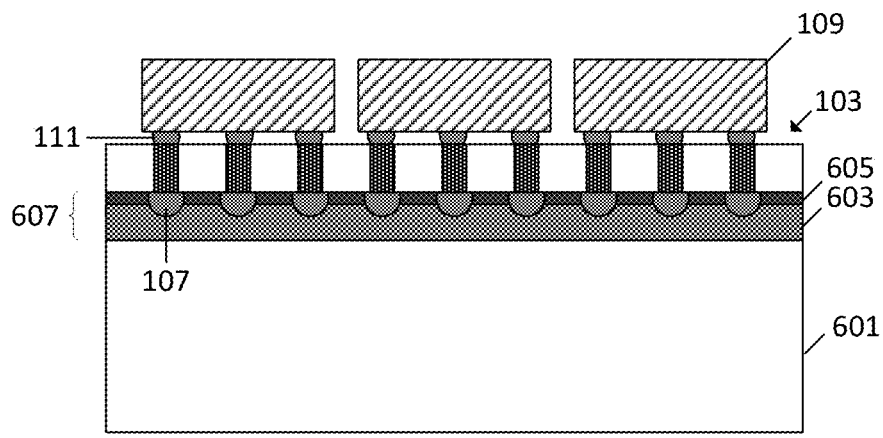
Figures 6, 7, 8:
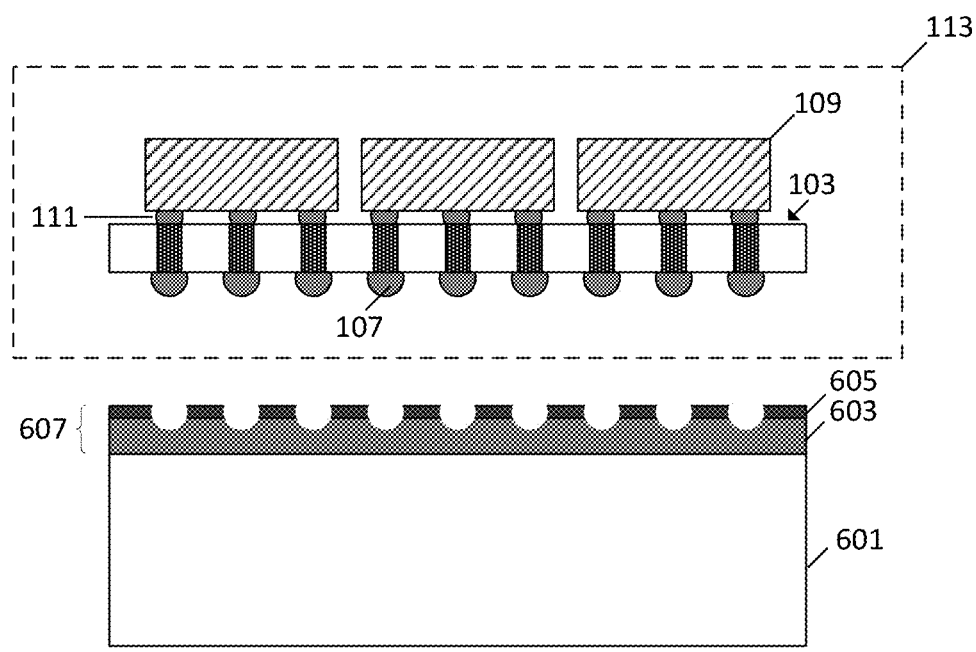
Figures 6, 7, 8, 9:
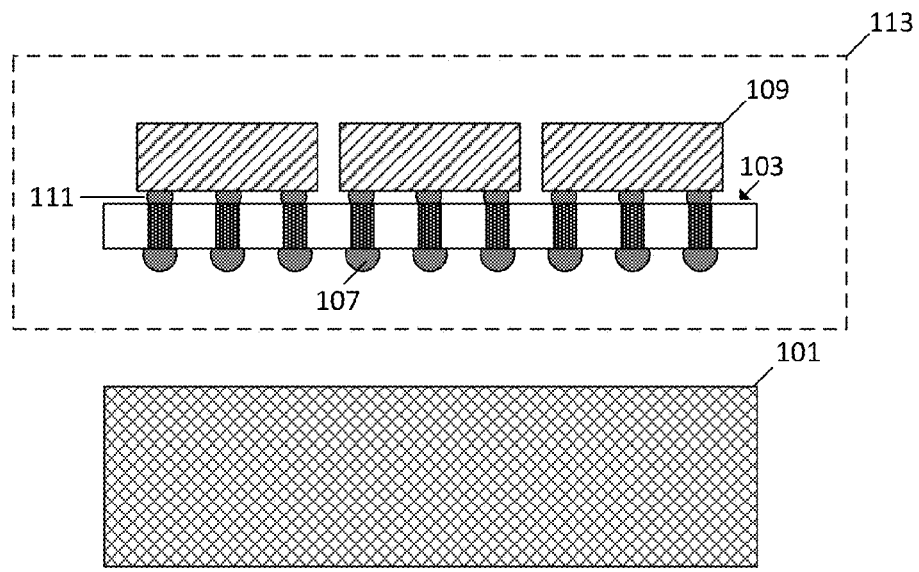
Figures 6, 7, 8, 9, 10:
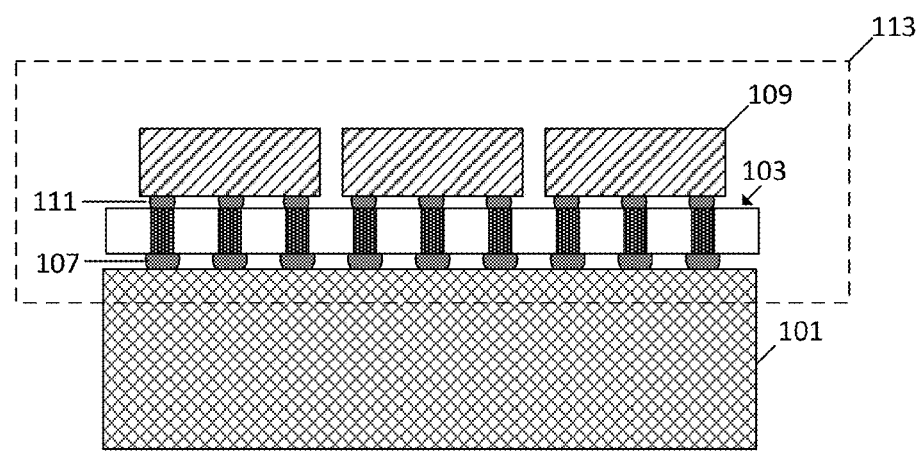

The stacked interposer unit 113 may then be removed from the support layer 607 as illustrated in FIG. 6-8. In some embodiments, a chemical dissolution process may be used to remove the stacked interposer 113 unit from the support layer 607. The chemical dissolution effectively releases the stacked interposer unit 113 from the support layer 607 (e.g., glue layer 603 and release layer 605) formed on the surface of the support wafer 601.

The stacked interposer unit 113 may then be bonded to an organic substrate 101, as illustrated in FIG. 6-9. In some embodiments the stacked interposer unit 113 may be bonded to the organic substrate 101 using a process known as reflow joining. As discussed above, the organic substrate 101 may include underlying circuitry and various external pads (not shown) for forming connections to the underlying circuitry. The stacked interposer unit 113 may be placed such that solder bumps 107 correspond to external pads (not shown) of the organic substrate so that connections may be formed from the IC dies 109 to the underlying circuitry of the organic substrate 101 through the TSV interposer 103.

FIG. 6-10 illustrates stacked interposer unit 113 after it has been bonded to the organic substrate 101. The stacked interposer unit 113 (e.g., IC dies 109, TSV interposer 103, and solder bumps 107) and the organic substrate 101 together form the flip chip 300. In some embodiments, a process known as reflow joining may be used to melt solder bumps 107 coupled to the bottom surface of the TSV interposer 103 in order to form connections between the TSV interposer 103 and the organic substrate 101.

Much like the methods for flip chip stacking described in FIGS. 3-1 to 3-8 and FIGS. 4-1 to 4-8, by introducing a support layer to mechanically support the TSV interposer during the process of placing IC dies on the TSV interposer, the TSV interposer may be shielded from warpage, thereby improving IC die performance and assembly yield in comparison to conventional flip chip stacking approached.

Although particular embodiments have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. A method for flip chip stacking, comprising:
   forming a cavity wafer comprising a plurality of cavities and a pair of corner guides;
   placing a through-silicon-via (TSV) interposer with solder bumps coupled to a surface of the TSV interposer on the cavity wafer, such that the solder bumps are situated in the plurality of cavities and the TSV interposer is situated between the pair of corner guides;
   placing an integrated circuit (IC) die on another surface of the TSV interposer, such that the IC die, the TSV interposer, and the solder bumps form a stacked interposer unit;
   removing the stacked interposer unit from the cavity wafer; and
   bonding the solder bumps of the stacked interposer unit to an organic substrate such that the stacked interposer unit and the organic substrate form a flip chip.

2. The method of claim 1, wherein the plurality of cavities extend from a top surface of the cavity wafer to a bottom surface of the cavity wafer.

3. The method of claim 2, further comprising applying a vacuum to the bottom surface of the cavity wafer to hold the TSV interposer with solder bumps in place relative to the cavity wafer.

4. The method of claim 1, further comprising:
   forming a layer of removable glue on a surface of the cavity wafer that includes the plurality of cavities and the pair of corner guides; and
   placing the TSV interposer with solder bumps on the layer of removable glue, such that the layer of removable glue holds the TSV interposer in place relative to the cavity wafer.

5. The method of claim 1, further comprising performing reflow joining to attach the integrated circuit die to the other surface of the TSV interposer.

6. The method of claim 5, further comprising performing underfilling after the reflow joining is performed.

7. The method of claim 1, wherein the act of removing the stacked interposer unit comprises performing chemical dissolution.

8. The method of claim 1, wherein the act of bonding the solder bumps of the stacked interposer unit to the organic substrate comprises performing reflow joining.

9. The method of claim 1, further comprising melting IC solder bumps associated with the integrated circuit die.

10. The method of claim 1, wherein the plurality of cavities are formed by patterning photoresist on a wafer, performing a reactive ion dry etch of the wafer with the patterned photoresist, and removing the photoresist with an organic solvent.

11. The method of claim 1, further comprising placing another integrated circuit (IC) die on the TSV interposer.

12. A method for flip chip stacking, comprising:
   forming a support layer having a glue layer and a release layer on a surface of a wafer;
   placing a through-silicon-via (TSV) interposer with solder bumps coupled to a surface of the TSV interposer on the support layer, such that the solder bumps are situated at least partially in the glue layer and the release layer of the support layer, and at least a part of the TSV interposer is situated above a surface of the support layer;
   placing an integrated circuit (IC) die on another surface of the TSV interposer, such that the IC die, the TSV interposer, and the solder bumps form a stacked interposer unit;

removing the stacked interposer unit from the support layer by performing chemical dissolution to the glue layer and the release layer; and bonding the solder bumps of the stacked interposer unit to an organic substrate such that the stacked interposer unit and the organic substrate form a flip chip.

13. The method of claim 12, further comprising performing reflow joining to attach the integrated circuit die to the other surface of the TSV interposer.

14. The method of claim 13, further comprising performing underfilling after the reflow joining is performed.

15. The method of claim 12, wherein the act of bonding the solder bumps of the stacked interposer unit to the organic substrate comprises performing reflow joining.

16. The method of claim 12, further comprising melting IC solder bumps associated with the integrated circuit die.

17. The method of claim 12, further comprising placing another integrated circuit (IC) die on the TSV interposer.

18. The method of claim 1, wherein the TSV interposer with the solder bumps coupled to the surface of the TSV interposer is placed on the cavity wafer to allow the TSV interposer with the solder bumps to be mechanically stabilized by the cavity wafer.

19. The method of claim 12, wherein the TSV interposer with the solder bumps coupled to the surface of the TSV interposer is placed on the support layer to allow the TSV interposer with the solder bumps to be mechanically stabilized by the support layer.

20. The method of claim 12, wherein the act of placing the TSV interposer with the solder bumps coupled to the surface of the TSV interposer on the support layer comprises applying temperature and pressure.

* * * * *